US011089403B1

(12) United States Patent
Noriyuki et al.

(10) Patent No.: US 11,089,403 B1
(45) Date of Patent: Aug. 10, 2021

(54) DIRECTIVITY CONTROL SYSTEM

(71) Applicant: DREAM INCORPORATED, Kanagawa (JP)

(72) Inventors: Masanobu Noriyuki, Kanagawa (JP); Hiroyuki Ota, Tokyo (JP); Akira Masu, Tokyo (JP)

(73) Assignee: Dream Incorporated, Kanagawa (JP)

( * ) Notice: Subject to any disclaimer, the term of this patent is extended or adjusted under 35 U.S.C. 154(b) by 0 days.

(21) Appl. No.: 17/254,197

(22) PCT Filed: Jun. 12, 2019

(86) PCT No.: PCT/JP2019/023310
§ 371 (c)(1),
(2) Date: Dec. 18, 2020

(87) PCT Pub. No.: WO2020/044728
PCT Pub. Date: Mar. 5, 2020

(30) Foreign Application Priority Data

Aug. 31, 2018 (JP) .............................. JP2018-163341

(51) Int. Cl.
| | |
|---|---|
| *H04R 3/12* | (2006.01) |
| *H04R 1/08* | (2006.01) |
| *G06K 9/00* | (2006.01) |
| *G10L 25/51* | (2013.01) |
| *G06F 3/16* | (2006.01) |
| *G06F 3/147* | (2006.01) |
| *H04R 1/40* | (2006.01) |

(Continued)

(52) U.S. Cl.
CPC .............. *H04R 3/12* (2013.01); *G06F 3/147* (2013.01); *G06F 3/162* (2013.01);
(Continued)

(58) Field of Classification Search
None
See application file for complete search history.

(56) References Cited

U.S. PATENT DOCUMENTS

| 9,716,961 B2 | 7/2017 | Oellers et al. | |
|---|---|---|---|
| 2016/0255434 A1* | 9/2016 | Yamamoto | H04R 3/12 381/305 |

(Continued)

FOREIGN PATENT DOCUMENTS

| JP | 2000-285709 A | 10/2000 |
|---|---|---|
| JP | 2006157857 A | 6/2006 |

(Continued)

OTHER PUBLICATIONS

International Search Report dated Sep. 3, 2019 from corresponding International Patent Application No. PCT/JP2019/023310, 5 pages.

(Continued)

*Primary Examiner* — Paul W Huber
(74) *Attorney, Agent, or Firm* — Ohlandt, Greeley, Ruggiero & Perle, L.L.P.

(57) ABSTRACT

The disclosure of the present specification aims to provide a directivity control system for speakers, which is capable of easily controlling directivity of acoustic data to provide desired sound fields with a plurality of speakers, and freely producing sound fields with high accuracy. A plurality of physically connected speaker units are virtually arrayed at respective directivity angles according to control signals that define the directivity angles. Virtual delay time data is calculated for the case where data is outputted with the virtual array, and output is performed according to output data affected by the delay time data, so that desired sound fields can be formed with the speaker units remaining fixed, without the necessity of mechanically rotating the speaker units.

19 Claims, 6 Drawing Sheets

(51) Int. Cl.
    *G01P 5/00*         (2006.01)
    *G01K 13/024*     (2021.01)
    *H03F 3/24*         (2006.01)

(52) U.S. Cl.
    CPC ..... *G06K 9/00335* (2013.01); *G06K 9/00778* (2013.01); *G10L 25/51* (2013.01); *H04R 1/08* (2013.01); *H04R 1/403* (2013.01); *G01K 13/024* (2021.01); *G01P 5/00* (2013.01); *H03F 3/24* (2013.01); *H03F 2200/03* (2013.01); *H04R 2430/01* (2013.01)

(56) References Cited

U.S. PATENT DOCUMENTS

2016/0295340 A1\* 10/2016 Baker .................... H04S 7/302
2017/0208392 A1\* 7/2017 Smithers ................ H04R 3/04

FOREIGN PATENT DOCUMENTS

| | | |
|---|---|---|
| JP | 2009-231980 A | 10/2009 |
| JP | 4591145 B2 | 9/2010 |
| JP | 2012-85340 A | 4/2012 |
| JP | 2016-524862 A | 8/2016 |
| JP | 2017-500785 A | 1/2017 |
| JP | 2017-532898 A | 11/2017 |
| WO | 2012/169095 A1 | 12/2012 |

OTHER PUBLICATIONS

Written Opinion dated Sep. 3, 2019 from corresponding International Patent Application No. PCT/JP2019/023310, 5 pages.
International Preliminary Examination Report on Patentability dated Mar. 4, 2020 from corresponding International Patent Application No. PCT/JP2019/023310, 5 pages.

\* cited by examiner

FIG.6
(a)
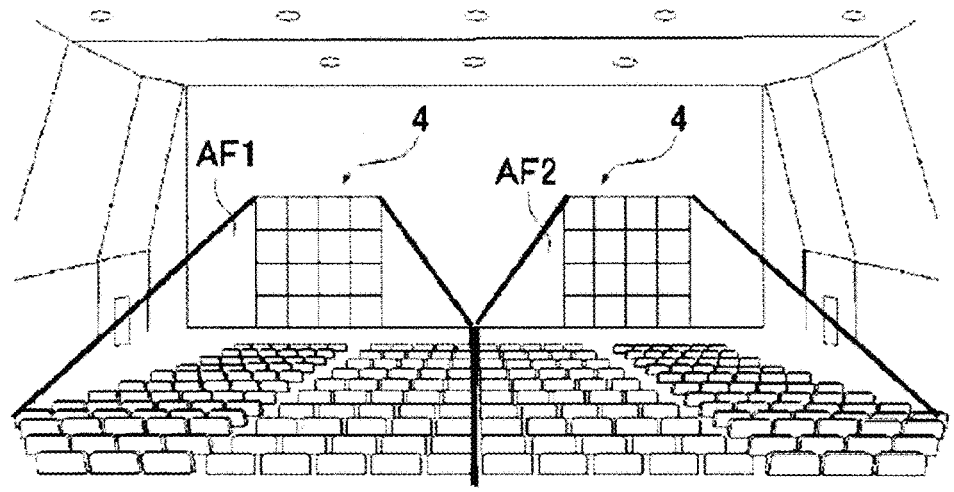
(b)
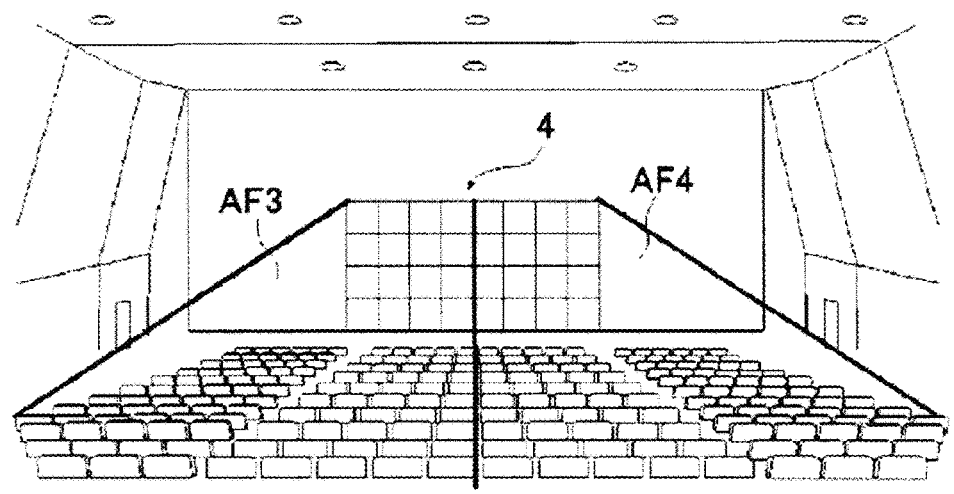
(c)
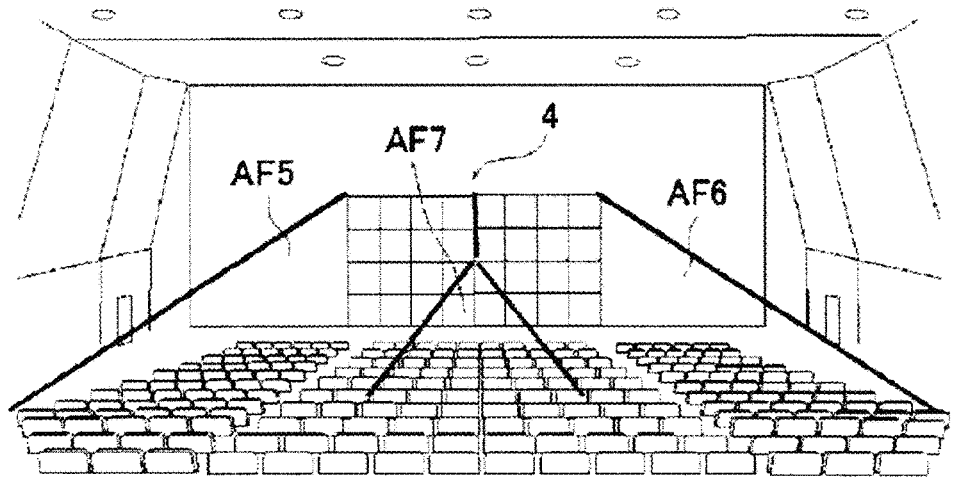

DIRECTIVITY CONTROL SYSTEM

TECHNICAL FIELD

The disclosure of the present specification relates to a directivity control system which forms a variety of sound fields via a plurality of speaker units.

BACKGROUND ART

For example, there has been proposed a sound system that forms desired sound fields by using an array of a plurality of speakers when providing acoustic output to an audience in a large venue (e.g., see PTL 1).

According to the technique disclosed in PTL 1, the sound system has a configuration including a plurality of speaker units each including an array of a plurality of speakers; a connecting means connecting the plurality of speaker units at predetermined angles; a connection posture detecting means detecting an angle between adjacent speaker units, which are connected by the connecting means, as a connection posture; and a control means controlling a sound emission direction by determining a delay amount of an audio signal supplied to the speakers of each of the plurality of speaker units, based on a set sound emission direction and a detected connection posture.

This configuration, in which a plurality of speaker units are connected in a predetermined postural relationship and sound fields are formed according to the connection postures, can enhance installation flexibility and perform optimal directivity control according to the installation conditions and the required sound fields. In other words, the above configuration can provide sound fields as desired.

Also, there has been proposed a distributed structure system having a plurality of assembly units each including acoustic transducers and a module controller. Using a model-based method, each module controller performs wavefront synthesis for the acoustic transducers of each assembly unit by using audio signals and related data, so that the acoustic transducers are ensured to be activated in the assembly unit by an actuation signal corresponding to the synthesis (e.g., see PTL 2).

This configuration can reproduce the sound fields of the sound sources in a predetermined space where an audience is present, using a plurality of acoustic transducers (speakers), based on the principle of wavefront synthesis.

CITATION LIST

Patent Literature

Patent Literature 1: JP 2006-157857 A
Patent Literature 2: U.S. Pat. No. 9,716,961

SUMMARY OF THE INVENTION

Solution to Problem

However, the technique disclosed in PTL 1 suffers from a complicated structure due to the configuration in which a plurality of flat speaker units are mechanically rotated at a predetermined rotation angle θ. Specifically, each flat speaker unit is required to be provided with a connection member having a connection protrusion and a corresponding insertion hole. Therefore, in addition to complicating the structure, there arises an issue of increasing the total weight of the speaker units and impairing ease of transportation.

Furthermore, adjacent flat speaker units are required to be manually moved in order to achieve an angle therebetween that satisfies the desired connection posture. This raises an issue of increasing installation workload. This sound system may be provided with drive units for mechanically rotating the plurality of flat speaker units in order to alleviate the manual workload. However, this may involve cost for installing the drive units for mechanically moving the speaker units, although the workload may be alleviated. In particular, if the desired sound fields are large, the audio signals are required to be outputted over a wide area. In this case, an attempt to increase the number of flat speakers configuring each flat speaker unit may raise another issue of increasing the total height and weight of the flat speaker units and increasing the load of rotating and transporting the flat speaker units.

According to the configuration disclosed in each embodiment of this technique, a speaker unit is defined to be a panel or a rod where speakers are provided in an array. The speakers are in a fixed state because the rotation at the rotation angle θ is performed on a per-panel basis or on a per-rod basis. Accordingly, in this configuration, directivity cannot be controlled on a per-speaker basis. If a mechanism corresponding to the above connection member is provided to each speaker, high accuracy directivity control can be achieved. However, performing such per-speaker-basis control by the above mechanical structure cannot be a practical solution, from any of the perspectives of manufacturing cost, weight, workload, and the like. Thus, the above technique suffers from an issue that directivity cannot be controlled with high accuracy.

For example, in the case where a sound-receiving target position is moving, such as when acoustic data is provided to a moving audience being tracked, the flat speaker units are required to be rotated every time the target moves. Thus, acoustic data is unlikely to be provided to the audience in a timely manner.

According to the technique disclosed in PTL 2, the positions of the virtual sound sources can be sufficiently rapidly changed by the module controllers, and therefore, the issues of PTL 1 can be solved. However, this system, which reproduces the sound fields by virtual sound sources, suffers from an issue that the sound from the sound sources cannot freely reach desired sound-receiving positions.

To solve the issues set forth above, the disclosure of the present specification aims to provide a directivity control system for speakers which is capable of easily controlling directivity of acoustic data to provide desired sound fields with a plurality of speakers, and freely and timely producing sound fields with high accuracy.

Solution to Problem

To achieve the aim set forth above, a directivity control system disclosed in the present specification has most important features that a plurality of physically connected speaker units are virtually arrayed at respective directivity angles according to control signals that define the directivity angles; that virtual delay time data is calculated for the case where sound from sound sources is outputted with the virtual array; and the sound from the sound sources is outputted according to output data affected by the delay time data, so that desired sound fields can be formed with the speaker units remaining fixed, without the necessity of mechanically rotating the speaker units.

A directivity control system disclosed in the present specification is one that forms a variety of sound fields via a plurality of speaker units, and is characterized by a speaker block, an interface section, an arithmetic section, an acoustic data processing section, and an amplification section. In the speaker block, a plurality of speaker units are grouped by being fixedly connected in a predetermined array, each speaker unit having characteristics of being capable of output in the same phase from any site of a flat diaphragm, and being capable of sound reproduction covering all frequency bands.

The interface section receives an acoustic signal and a control signal for each of the plurality of speaker units configuring the speaker block. The acoustic signal outputs sound from a sound source. The control signal defines a directivity angle for the output according to at least horizontal directivity angle data and vertical directivity angle data, relative to a set position of each of the speaker units.

The arithmetic section calculates virtual delay time data for each of the speaker units, which are in a virtual array at the defined directivity angles, from the control signal received by the interface section, by separately calculating delay times of the upper end and lower end speaker units for the horizontal direction and separately calculating delay times of the left end and right end speaker units for the vertical direction, with intermediate portions between the upper and lower ends and between the left and right ends being interpolated based on the characteristics, and by adding horizontal delay time data calculated from the horizontal directivity angle and vertical delay time data calculated from the vertical directivity angle, the arithmetic section further calculating characteristic correction amount data for matching a sound volume or frequency characteristics in the case of the speaker units being in the virtual array, with either of a sound volume and frequency characteristics in the case of the speaker units being in a physical array at the respective directivity angles.

The acoustic data processing section produces acoustic data from each acoustic signal received by the interface section, while producing output data that can reach a predetermined sound-receiving position by subjecting the speaker block to pseudo rotation based on the acoustic data, the delay time data corresponding to the acoustic data, and the characteristic correction amount data, and permitting the sound of the sound source to advance linearly, diffused or focused at the defined directivity angle.

The amplification section amplifies the output data so as to be outputted to each of the speaker units.

The system is characterized in that the output data is outputted from the amplification section via each of the speaker units to form a predetermined sound field by the speaker block.

With this configuration, delay time can be calculated from a virtual directivity angle to allow the sound from the sound source to reach a desired sound-receiving position to form a sound field there, without the necessity of mechanically rotating the speaker units.

And with this configuration, a directivity angle can be precisely specified in the horizontal direction (X-axis direction) and the vertical direction (Y-axis direction), and processing load can be reduced due to the calculation formula being binomial.

Since directivity is controlled according to the delay time data in the present system without physically moving the speaker units such as by rotation, the sound pressure may increase or a phase deviation may occur even more compared to the case where the speaker units are physically moved over a distance corresponding to a calculated delay time. Therefore, the arithmetic section may calculate the characteristic correction amount to output sound from a sound source at a directivity angle practically corresponding to the delay time data.

With this configuration, sound emission can be controlled as desired to allow the sound from the sound source to reach a desired position.

The interface section may be configured to receive a plurality of different acoustic signals corresponding to a plurality of different sound sources, while receiving control signals corresponding to different directivity angles defined for the respective sound sources, and the acoustic data processing section may be configured to produce different pieces of output data according to the different acoustic signals and control signals.

With this configuration, sound sources whose number corresponds to the number of channels can be simultaneously outputted in the plurality of channels with respective different directivity patterns.

The system may further include a sensor that detects at least either of a wind direction/speed and a temperature of a sound field where the output data is outputted, and the arithmetic section may calculate variation (change amount) data according to data detected by the sensor, and may calculate the delay time data based on the calculated variation (change amount) data.

With this configuration, variation in sound pressure can be corrected, which would be caused by air absorption when the sound propagates, due to changes in the sound field environment.

The directivity control system may be configured to include at least a crowd behavior analysis section and an input section. The crowd behavior analysis section may analyze and detect the occurrence of events based on the crowd behavior detected by a monitoring sensor that is configured by an acoustic sensor and an image sensor, while specifying the area where the event has occurred, and may measure a directivity angle relative to the specified area. The input section may produce a control signal when the occurrence of the event has been detected and a directivity angle that specifies the area has been measured, the control signal corresponding to the measured directivity angle, while producing the acoustic signal using a sound source oriented toward the area where the event has occurred.

With this configuration, information can be supplied in a timely manner to the crowd in the area where the event causing the behavior of the crowd has occurred.

The system may include a storage section that stores in advance data of a directivity angle defined for the sound from the sound source to reach a predetermined sound-receiving position of a predetermined sound field. When data of a predetermined directivity angle is read from the storage section, the read data of the directivity angle may be automatically received by the interface section.

With this configuration, data required for directivity control can be easily inputted for a sound field where the directivity angle is specified in advance.

A speaker array may be formed by physically binding a plurality of speaker blocks to enable directivity control with the entirety of the array according to directivity control of the speaker blocks.

With this configuration, directivity control can be easily and precisely performed in large-scale sound fields.

The speaker units may be arranged at least in a flat, cylindrical or spherical shape in the entirety of the speaker block or the speaker array.

With this configuration, sound fields can be flexibly formed in conformity with the installation environment.

Advantageous Effects of the Invention

The directivity control system for speakers disclosed in the present specification exerts advantageous effects of easily controlling directivity of acoustic data to form desired sound fields with a plurality of speakers, and freely and timely producing sound fields with high accuracy.

In particular, directivity can be controlled by calculating virtual delay time data of the speaker units which are virtually arranged at predetermined directivity angles, without the necessity of physically moving the speakers. Accordingly, it is advantageous that a variety of angles, when needed, can be set easily and promptly.

BRIEF DESCRIPTION OF THE DRAWINGS

FIG. 6 is a set of diagrams illustrating examples in the case where the directivity control system disclosed in the present specification is used in a concert venue, in which (a) is a diagram illustrating an example in which a speaker array is divided into two divisions and sound from different sound sources is outputted to two regions from the two divisions, (b) is a diagram illustrating an example in which sound from different sound sources is outputted to two regions from a single speaker array, and (c) is a diagram illustrating an example in which sound from different sound sources is outputted to three regions from a single speaker array.

DESCRIPTION OF THE EMBODIMENTS

Figure 1:
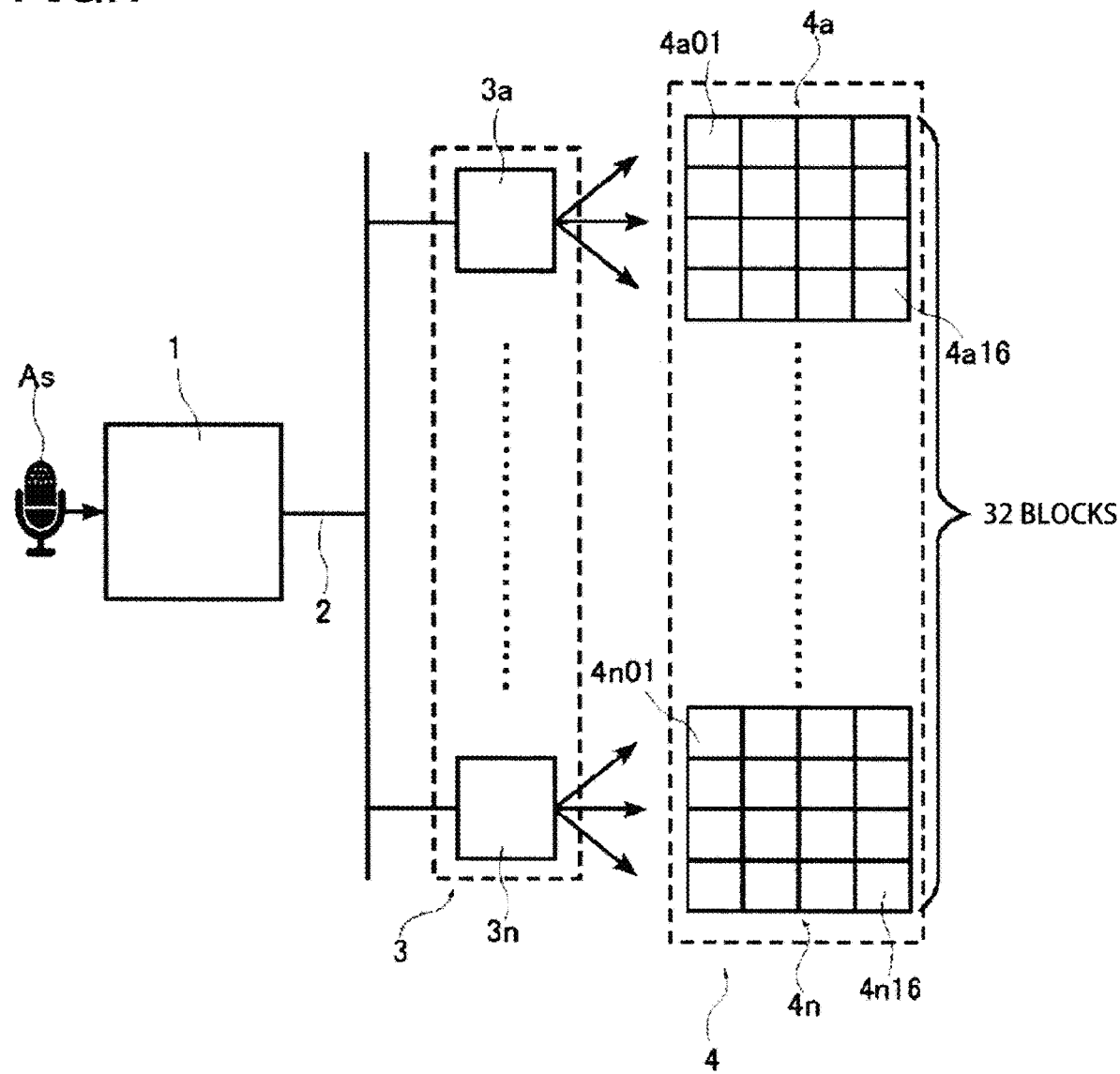
FIG. 1 is a schematic diagram illustrating a directivity control system disclosed in the present specification.

Referring to the drawings, some embodiments of the present disclosure will be described. If a component of an embodiment previously described is included in an embodiment subsequently described, the component in the subsequent embodiment is designated with a reference sign as in the previous embodiment to omit duplicate description. If only a part of a configuration is described in each embodiment, other parts of the configuration may be designated with reference signs used in the previously described embodiment. Even when possible specific combinations between embodiments are not explicitly shown, the embodiments can be partially combined unless the combinations pose any particular problems.

FIG. 1 shows a system controller 1 configuring a directivity control system disclosed in the present specification. The system controller 1, after receiving a voice input or the like from a sound source As, transmits a control signal for directivity control to a power amplifier 3 via a transmission path 2, together with an acoustic signal. An acoustic signal refers to an audio signal or a sound signal emitted from sound sources other than a voice. The system controller 1 can transmit an acoustic signal and a control signal of a plurality of channels through a single transmission path. The transmission path 2 may be wired or wireless. For example, if a LAN cable is used for the transmission path 2 and the system controller 1 has 6 channels, of four twisted wire pairs in the LAN cable, one pair can be used for a control signal and three pairs can be used for an acoustic signal. One pair can transmit a 2-channel acoustic signal in the case of digital transmission. Therefore, a single LAN cable can transmit a 6-channel acoustic signal.

As will be described later, the power amplifier 3 incorporates a digital signal processor (DSP) to digitally process the acoustic signal and the control signal. A plurality of power amplifiers 3 (3a to 3n) are connected to the system controller 1. The power amplifiers 3a to 3n respectively control a plurality of speaker blocks 4a to 4n configuring a speaker array 4.

The speaker block 4a is configured by speaker units 4a01 to 4a16, while the speaker block 4n is configured by speaker units 4n01 to 4n16. Specifically, a plurality of speaker units are grouped by being physically connected to each other in a predetermined array to form a speaker block. Furthermore, a plurality of speaker blocks are physically bound to each other to form a speaker array. As an example, in the present embodiment, 4 by 4 speaker units 4a01 to 4a16 are physically connected to each other in the speaker block 4a and, similarly, 4 by 4 speaker units 4n01 to 4n16 are physically connected to each other in the speaker block 4n. In the present embodiment, a total of 32 such speaker blocks 4a to 4n are physically bound to each other to form the speaker array 4. However, the number of physically connected speaker units, or the number of physically bound speaker blocks should not be limited to that of the present embodiment. In the present embodiment, the overall shape of array resulting from the physical connection or physical binding is flat. However, the entire shape may be cylindrical or spherical. Furthermore, some components in a speaker block may be separated and disposed in another housing.

The speaker units may be configured by any type of speakers, such as multi-cell flat speakers or single cone full range speakers. The present embodiment will be described based on speaker units configured by multi-cell flat speakers.

Flat speakers generate plane waves by driving the overall surface thereof, are less likely to have their sound pressure attenuate due to distance, and emit sound whose focal point is a point at infinity. Accordingly, flat speakers are favorably used in the case of forming a variety of sound fields via the speaker units.

Furthermore, since a single speaker unit can reproduce sound covering all frequency bands, there is no deviation in directivity that would otherwise occur depending on frequency bands. In addition, adopting flat speakers enables accurate directivity control owing to the following points. Specifically, these points are that: sound emission, such as divided vibration, which is not correlated between speaker units, is reduced due to the structure in which the speaker units are formed into a speaker block; sound can be emitted in the same phase from any site of a diaphragm of each speaker unit due to the diaphragm being flat; sound emitted behind a speaker unit does not affect another speaker unit due to the speaker units being individually enclosed (this point applies to other speakers, such as single cone full range speakers mentioned above, in the same way as flat speakers); and the like.

The speaker blocks and the speaker array having the above configuration can be designed with any size in conformity with the environment, such as a venue, where desired sound fields are to be formed, and also can be used temporarily because they can be easily installed and removed.

Figure 2:
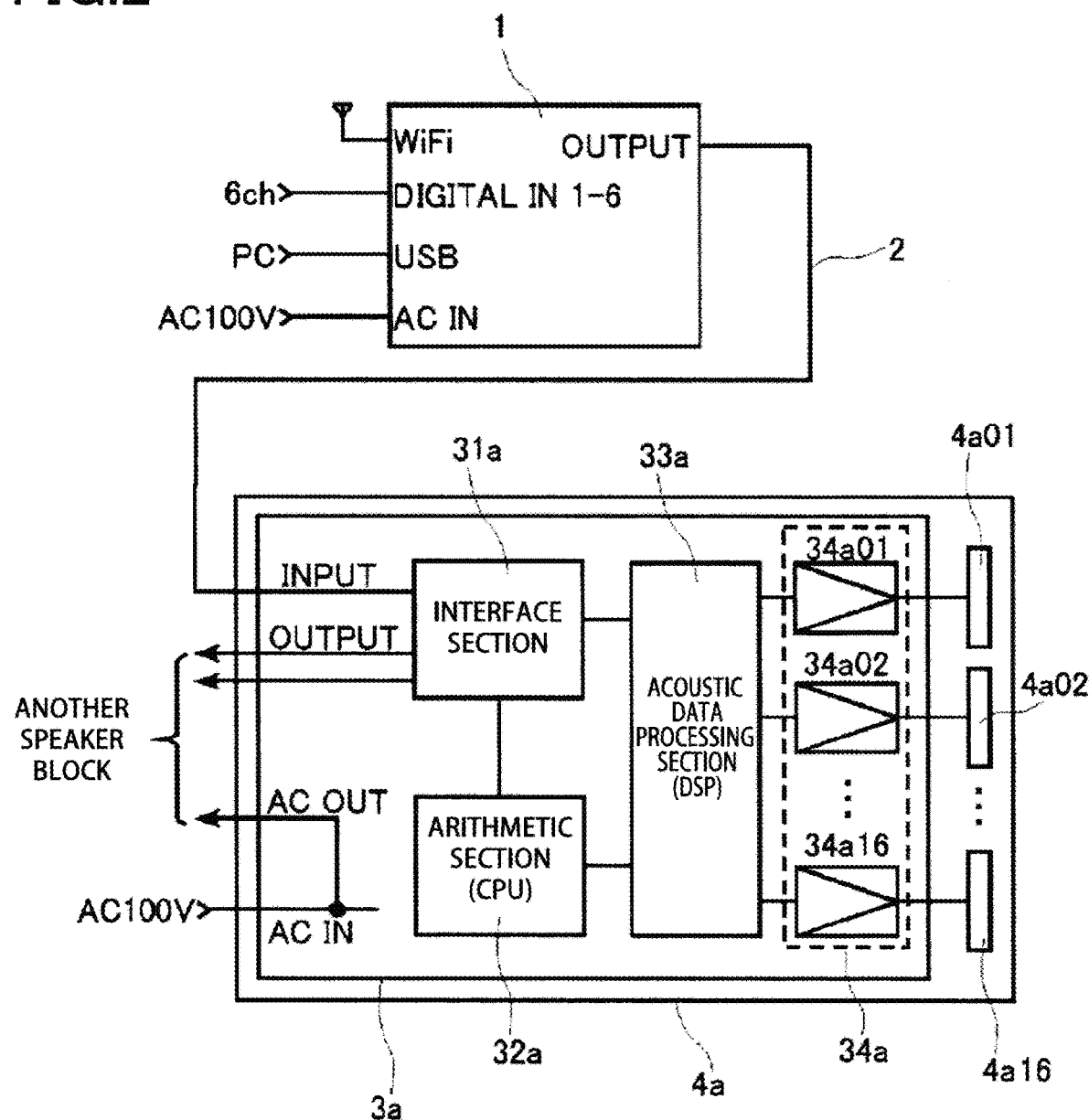
FIG. 2 is a block diagram illustrating a system controller and a power amplifier configuring the directivity control system disclosed in the present specification.

FIG. 2 is a block diagram illustrating the system controller 1 and the power amplifier 3a. For the convenience of description, FIG. 2 shows only the power amplifier 3a. However, as explained referring to FIG. 1, power amplifiers are connected to respective speaker blocks. Therefore, actually, a plurality of power amplifiers 3a to 3n (32 power amplifiers in the present embodiment) are connected to the system controller 1 via the transmission path 2.

The system controller 1 selects a plurality of types of directivity patterns, i.e., data in which directivity angles are defined, and inputs the patterns therein as control signals. The signals may be inputted using a personal computer connected to the system controller 1 via WiFi or USB. Acoustic signals can be inputted through a plurality of channels (six channels in the present embodiment).

A control signal and an acoustic signal are transmitted from the system controller 1 to the power amplifier 3a via the transmission path 2. In the power amplifier 3a, an interface section 31a receives the transmitted control signal and acoustic signal.

When a control signal is received by the interface section 31a, an arithmetic section 32a calculates virtual delay time data for the speaker units which are virtually arrayed having the defined directivity angles mentioned above. Specifically, the arithmetic section 32a includes at least a central processing unit (CPU) and a memory (not shown), and allows the CPU to calculate delay time data from the control signal read into the memory.

The acoustic signal received by the interface section 31a is transmitted to an acoustic data processing section 33a (DSP) which produces acoustic data, while producing output data from the acoustic data and the corresponding delay time data.

The produced output data is amplified by an amplification section 34a for output to each of the speaker units 4a01, 4a02 to 4a16. The amplification section 34a is configured by amplification sections 34a01, 34a02 to 34a16 which correspond to the speaker units 4a01, 4a02 to 4a16. Specifically, the power amplifier 3a independently performs digital signal processing of the control signal and acoustic signal for each of the speaker units, and thus can control, as will be described later, directivity patterns of the individual speaker units vertically and horizontally.

Processing in the acoustic data processing section 33a, i.e., calculation of various parameters, including delay time data related to DSP processing and the like, is all performed within the speaker block (performed by the power amplifier 3a in the speaker block). Therefore, the system controller 1 may only have to transmit the control signal related to the defined directivity angle and the acoustic signal obtained from the sound source. Therefore, the system controller 1 can perform control with a small amount of data, and thus can change directivity in real time through a low-speed line even if the speaker array 4 is designed with a large scale.

It should be noted that any mode can be used for the system controller 1 as long as the system controller 1 includes the configuration described above. Accordingly, the system controller 1 may be substituted by an existing personal computer, or alternatively, substituted by a mode in which the speaker blocks are respectively provided with operation knobs for directivity control, and sensors.

As described above, a predetermined sound field can be formed by the speaker block 4a by allowing the amplification section 34a to output individual pieces of output data via the respective speaker units 4a01, 4a02 to 4a16.

As mentioned above, if the speakers are formed into a cylindrical or spherical array by physical connection and physical binding, the delay time data may be calculated considering the front-back positional relationship between the speaker units.

The control signal used for calculating delay time data in the arithmetic section 32a is configured by at least horizontal directivity angle data and vertical directivity angle data, relative to the positions where the speaker units are established. The arithmetic section 32a calculates the delay time data by adding horizontal direction delay time data calculated from the horizontal directivity angle data and vertical delay time data calculated from the vertical directivity angle data.

Figure 3:
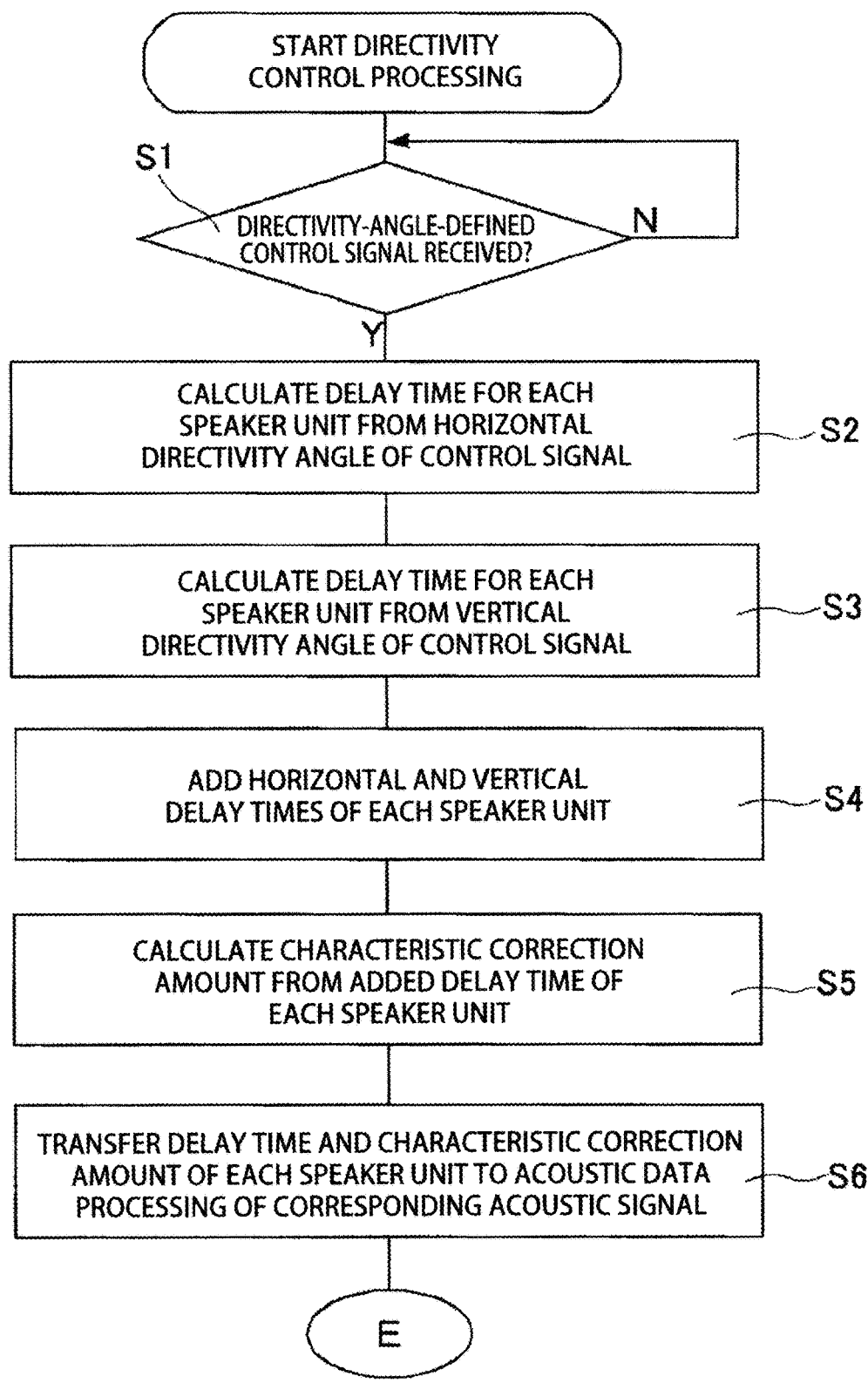
FIG. 3 is a flow diagram illustrating directivity control processing performed by an arithmetic section.

Referring to FIG. 3, a flow of directivity control processing performed by the arithmetic section 32a will be described. When a control signal is received by the interface section 31a (Y at S1), the arithmetic section 32a calculates a delay time of each speaker unit from the horizontal directivity angle data of the control signal (S2). The S1 determination loops until reception of a control signal is confirmed (N at S1).

Following calculation of the delay time for each speaker unit from the horizontal directivity angle, the arithmetic section 32a calculates a delay time for each speaker unit from the vertical directivity angle data (S3). It should be noted that the horizontal directivity angle data at S2 may instead be the vertical directivity angle data, while the vertical directivity angle data at S3 may instead be the horizontal directivity angle data.

Then, the arithmetic section 32a adds the horizontal and vertical delay times of the individual speaker units (S4). As described above, simple addition of the horizontal (X-axis direction) delay time data to vertical (Y-axis direction) delay time data enables precise directivity control, with directivity patterns rotating vertically and horizontally. More specifically, for the horizontal direction, delay times of the upper end and lower end speaker units may be separately calculated, while, for the vertical direction, delay times of the left end and right end speaker units may be separately calculated, so that delay times of the intermediate portions in these directions can be interpolated.

Other than the above, the arithmetic section 32a may calculate a characteristic correction amount for the calculated delay time data in terms of sound volume and/or frequency characteristics (S5). Since directivity is controlled based on the delay time data as described above, the sound pressure may increase, or further, a phase deviation may occur even more, compared to the case where each speaker unit is physically moved over a distance corresponding to a calculated delay time. Therefore, the arithmetic section 32a may calculate the characteristic correction amount and may permit it to affect the delay data to output sound from a sound source at a physical directivity angle practically corresponding to the delay time data.

The delay time data and the characteristic correction amount data of each speaker unit are then subjected to acoustic data processing for the corresponding acoustic signal (S6).

Figure 4:
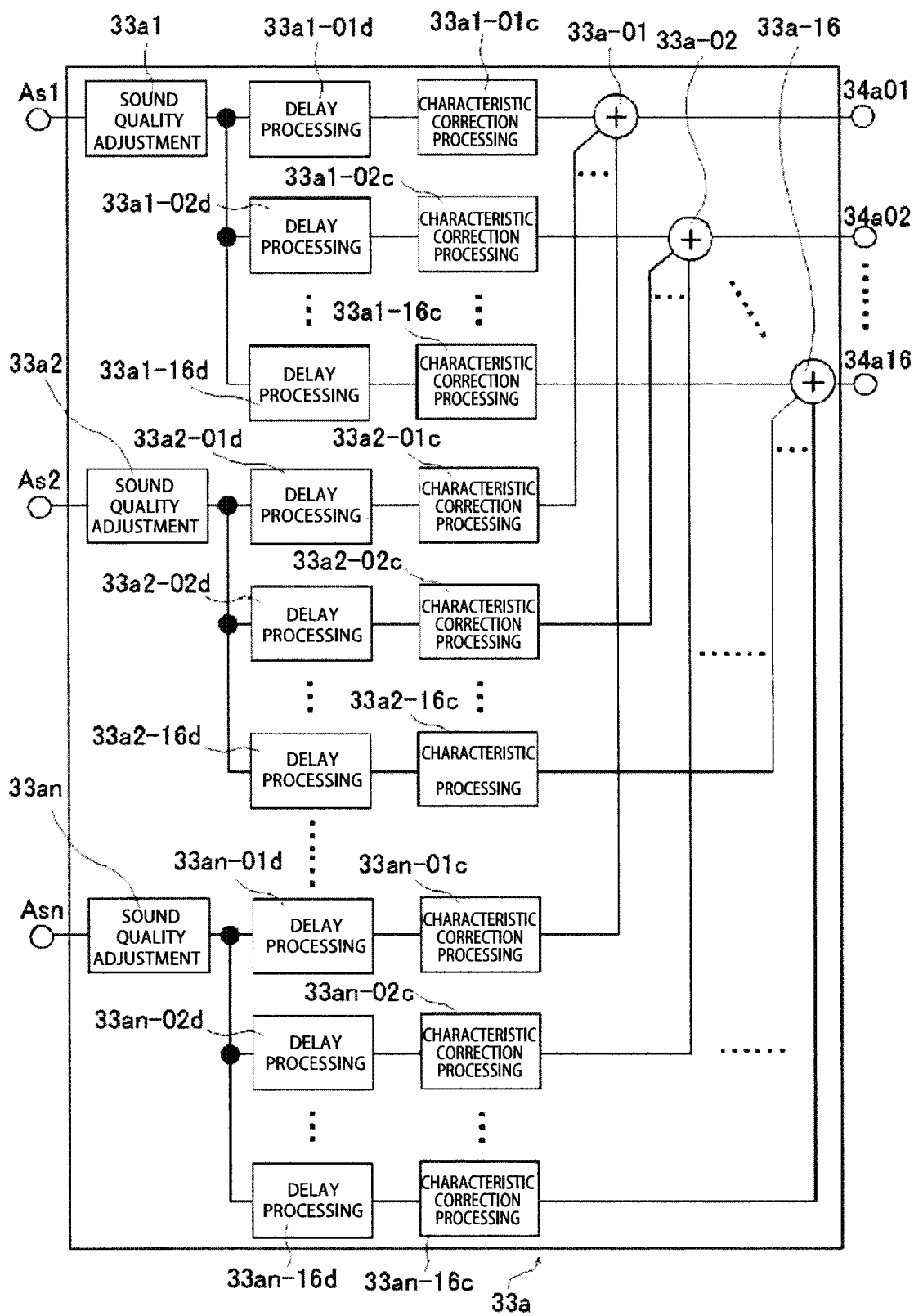
FIG. 4 is a block diagram illustrating processing performed by an acoustic data processing section to allow each of a plurality of sound sources to have different directivity.

Referring now to FIG. 4, processing performed by the acoustic data processing section 33a is described by way of an example of processing in which a different directivity pattern is provided to each of a plurality of sound sources.

From a plurality of different sound sources As1, As2 to Asn, pieces of acoustic data are respectively received by the acoustic data processing section 33a via the system controller 1, the transmission path 2, and the interface section 31a of the power amplifier 3a (not shown).

The received pieces of acoustic data are adjusted in terms of sound quality, and then combined with the delay time data and the characteristic correction amount data explained referring to FIG. 3. The following specific description will be provided by way of an example in which such synthesized data is outputted to the amplification sections 34a01, 34a02 to 34a16 corresponding to the speaker block 4a explained referring to FIG. 2. Sound quality adjustments 33a1, 33a2 to 33an corresponding to the sound sources As1, As2 to Asn are not processing that is directly related to directivity control, such as adjustment of frequency characteristics.

For the sound source As1, the acoustic data processing section 33a performs delay processing 33a1-01d and characteristic correction processing 33a1-01c corresponding to the amplification section 34a01. Similarly, the acoustic data processing section 33a performs delay processing 33a1-02d and characteristic correction processing 33a1-02c corresponding to the amplification section 34a02, to delay processing 33a1-16d and characteristic correction processing 33a1-16c corresponding to the amplification section 34a16.

For the sound source As2, the acoustic data processing section 33a performs delay processing 33a2-01d and characteristic correction processing 33a2-01c corresponding to the amplification section 34a01. Similarly, the acoustic data processing section 33a performs delay processing 33a2-02d and characteristic correction processing 33a2-02c corresponding to the amplification section 34a02, to delay processing 33a2-16d and characteristic correction processing 33a2-16c corresponding to the amplification section 34a16.

For a sound source Asn, the acoustic data processing section 33a performs delay processing 33an-01d and characteristic correction processing 33an-01c corresponding to the amplification section 34a01. Similarly, the acoustic data processing section 33a performs delay processing 33an-02d and characteristic correction processing 33an-02c corresponding to the amplification section 34a02, to delay processing 33an-16d and characteristic correction processing 33an-16c corresponding to the amplification section 34a16.

Following the delay processing and the characteristic correction processing for the sound sources As1, As2 to Asn, results of the delay processing and the characteristic correction processing are synthesized together in synthesis processing 33a-01. Specifically, the output data transmitted to the amplification section 34a01 includes three pieces of data resulting from the delay processing 33a1-01d and the characteristic correction processing 33a1-01c for the sound source As1, the delay processing 33a2-01d and the characteristic correction processing 33a2-01c for the sound source As2, and the delay processing 33an-01d and the characteristic correction processing 33an-01c for the sound source Asn.

Similarly, the output data transmitted to the amplification section 34a02 includes three pieces of data resulting from the delay processing 33a1-02d and the characteristic correction processing 33a1-02c for the sound source As1, the delay processing 33a2-02d and the characteristic correction processing 33a2-02c for the sound source As2, and the delay processing 33an-02d and the characteristic correction processing 33an-02c for the sound source Asn. These three pieces of data are synthesized together in synthesis processing 33a-02. Similarly, the output data transmitted to the amplification section 34a16 includes three pieces of data resulting from the delay processing 33a1-16d and the characteristic correction processing 33a1-16c for the sound source As1, the delay processing 33a2-16d and the characteristic correction processing 33a2-16c for the sound source As2, and the delay processing 33an-16d and the characteristic correction processing 33an-16c for the sound source Asn. These three pieces of data are synthesized together in synthesis processing 33a-16.

As described above, directivity is controlled for each channel of the system controller 1, and synthesis (mixing) is performed before the amplification sections 34a01, 34a02 to 34a16, to perform different directivity control for each channel.

Figure 5:
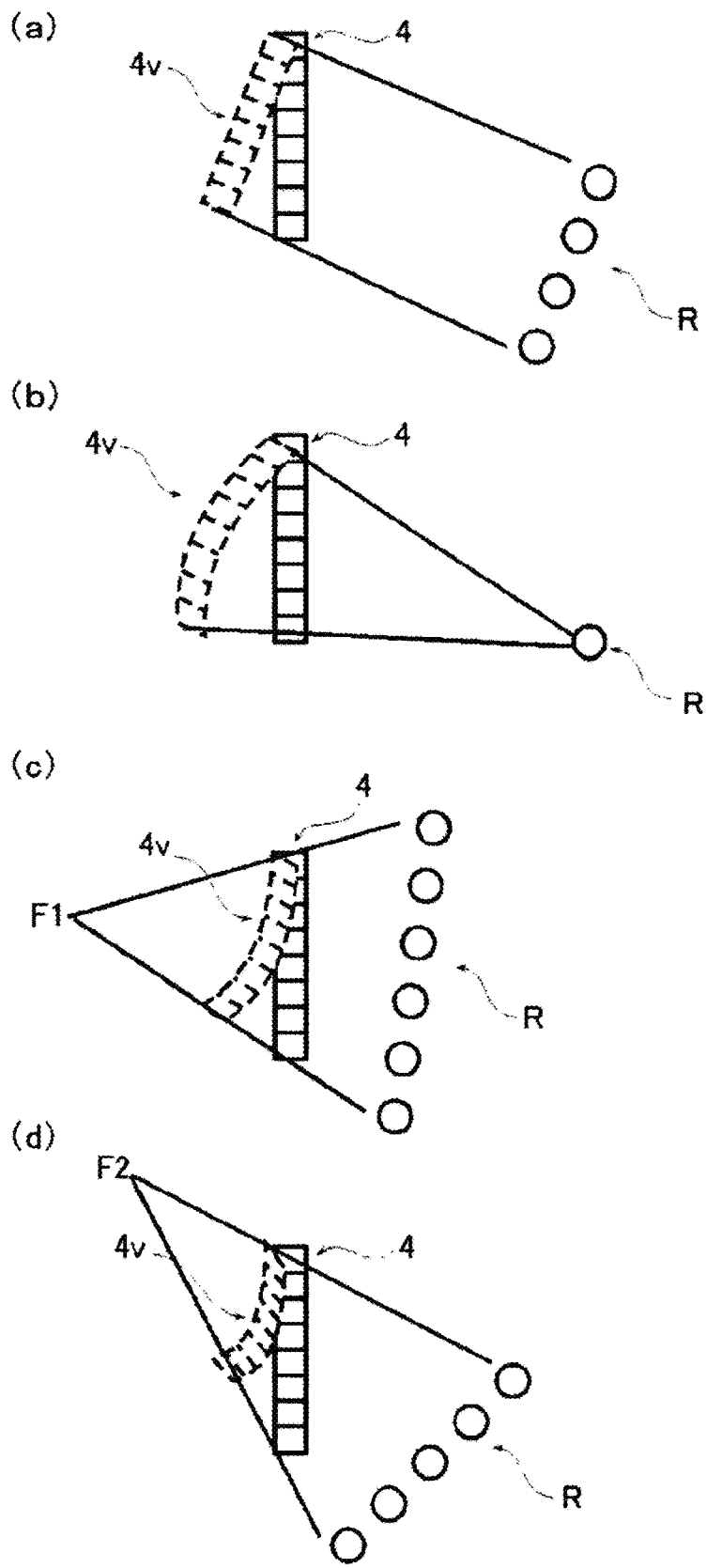
FIG. 5 is a set of diagrams illustrating modes of control performed by the directivity control system disclosed in the present specification, in which (a) is a diagram illustrating a linear propagation mode, (b) is a diagram illustrating a focused mode, (c) is a diagram illustrating a diffused mode (when the focus is within the width of the system), and (d) is a diagram illustrating a diffused mode (when the focus is outside the width of the system).

Referring to FIG. 5, control modes of the directivity control system disclosed in the present specification will be described. FIG. 5 schematically shows control modes each of which is explained using a speaker array 4 arranged in a plane, a virtual speaker array 4v virtually arranged according to delay time data, and sound-receiving positions R. FIG. 5 shows top views each illustrating a speaker array 4 and a virtual speaker array 4v, i.e., diagrams each illustrating the case of controlling a directivity angle in the horizontal direction (X-axis direction) with respect to a set position of the speaker array 4. However, a directivity angle in the vertical direction (Y-axis direction) can also be similarly controlled with respect to the set position. As described above, in the actual control, pieces of delay time data corresponding to the directivity angles in the X- and Y-axis directions are added, and sound is outputted from the sound sources with the virtual speaker array 4v being three-dimensionally controlled.

FIG. 5(a) shows a mode of directivity control in the case where both ends of the speaker array 4 are the same in directivity angle, or in other words, directivity direction. In this case, the speaker array 4 is subjected to backward pseudo rotation, centering on one end of the speaker array 4, so that the sound emission surface of the virtual speaker array 4v is oriented toward the directivity direction. In this state, delay time data of the individual speaker units may be calculated so that the entire sound emission surface of the virtual speaker array 4v would emit sound to the sound-receiving positions R in a linear manner.

FIG. 5(b) shows a mode of directivity control in the case where the sound-receiving positions are focused on one point from the speaker array 4. In this case, the speaker array 4 is subjected to backward pseudo rotation, centering on one end of the speaker array 4, so that the sound emission surface of the virtual speaker array 4v is oriented toward one point in the directivity direction, i.e., oriented toward the sound-receiving position R. Furthermore, in this state, the virtual speaker array 4v may be permitted to have an arc shape forming a fan centering on the sound-receiving position R, and delay time data of the speaker units may be calculated so that sound is emitted being focused on the sound-receiving position R.

FIG. 5(c) shows a mode of directivity control in the case where sound is diffused toward the sound-receiving positions R from the speaker array 4, i.e., in the case where a focus F1 on a side opposite to the diffusion direction is positioned within the width of the speaker array 4. In this case, the speaker array 4 is subjected to backward pseudo rotation, centering on one end of the speaker array 4, so that the rear surface of the virtual speaker array 4v facing away from the sound emission surface would be oriented toward the focus F1. Furthermore, in this state, the virtual speaker array 4v may be permitted to have an arc shape forming a fan centering on the focus F1, and delay time data of the speaker units may be calculated so that the sound emission surface emits diffused sound to the sound-receiving positions R. It should be noted that, in this case, the focus F corresponds to an intersection point of the lines drawn perpendicularly backward from the tangent lines at both ends of the virtual speaker array 4v.

FIG. 5(*d*) shows a mode of directivity control in the case where sound is diffused toward the sound-receiving positions R from the speaker array 4, i.e., in the case where a focus F2 on a side opposite to the diffusion direction is positioned outside the width of the speaker array 4. In this case also, arrangement of the virtual speaker array 4v is the same as in FIG. 5(*c*), however, the above center may be set so as to be outside the width of the speaker array 4.

FIG. 5 shows typical examples of directivity control modes, which can be applied to various types of control. For example, different directivity patters may be set on the four vertical and lateral sides of the speaker array 4. Alternatively, a narrow directivity pattern may be set near the sound emission surface of the speaker array 4, while a wide directivity pattern may be set far from the sound emission surface.

Furthermore, directivity angles may be set at four corners of the speaker array 4, or at any separate positions on the respective sides of the speaker array 4, and parameters (e.g., delay time data) therebetween may be interpolated to achieve directivity patterns with a complicated shape. Alternatively, only a part of the speaker array 4 may be used for emitting sound.

Alternatively, for example, different languages may be presented to respective areas having individual sound fields in a venue, such as a music hall, while sound is ensured not to reach the bottom of the balcony, the ceiling or the like of the venue, so that sound is emitted only toward the audience seats to reduce reflection, thereby enhancing sound clarity. Alternatively, a venue may be divided into a plurality of areas and these areas may receive different sound waves, so that there is less likely to be difference in sense of distance from the speaker array between the areas, thereby achieving uniform sound pressure.

As described above, sound can be emitted linearly, focused or diffused to control directivity angles as desired. Thus, sound can be emitted in any desired directions or only to selected areas, enabling easy setting of sound fields as desired.

<Modifications>

The directivity control system disclosed in the present specification may be configured to include a detector (not shown) that detects the temperature and/or the wind direction/speed in the sound fields where the output data is outputted, and the data detected by the detector may be used as a basis for calculating the delay time data. Specifically, in this configuration, the detector may be connected to the system controller 1, various sensor signals detected by the detector may be transmitted to the power amplifier 3 via the transmission path 2 together with the control signal and the acoustic signal, and the above calculation may be performed by the arithmetic section 32a.

When, for example, a temperature sensor of the detector has detected data, delay time data may be calculated using the following formula.

$$\text{Delay time [S]} = \text{Virtual arrangement position [m]} / \text{Sound speed [m/s]} \quad [\text{Math. 1}]$$

where,
sound speed [m/s]=331.45+0.067 t 331.45 [m/s]: Speed of sound in dry air at standard atmospheric pressure
0.067 [m/s]: Temperature coefficient
t: Temperature (° C.)

Specifically, the speed of sound depends on temperature (variable) and causes deviation in directivity angle. In this regard, if temperature change is detected by the temperature sensor, delay time data may be re-calculated by the above formula, and directivity control may be carried out in real time according to the temperature change over time.

If, for example, a wind direction/speed sensor of the detector detects data, a vector corresponding to the detected data may be calculated from the following formula and delay time data may be calculated based on the vector.

$$\text{Corrected vector [R]} = A - B \quad [\text{Math. 2}]$$

where,
A: Distance and angle vector to sound-receiving point
B: Vector detected by wind direction/speed sensor Specifically, if there is a wind between a sound source and a sound-receiving position, the sound transmitted by vibration of particles in the air may reach a point deviated from the targeted sound-receiving position, depending on the wind direction/speed. In this regard, the deviation caused by such a wind force may be corrected by this vector operation.

Correction based on data detected by a temperature sensor and correction based on data detected by a wind direction/speed sensor have been separately described. However, the detector may calculate delay time data by performing multiple corrections based on the data detected by a temperature sensor and a wind direction/speed sensor.

The directivity control system may be configured to include at least a crowd behavior analysis section and an input section. The crowd behavior analysis section may analyze and detect the occurrence of events based on the crowd behavior detected by a monitoring sensor that is configured by an acoustic sensor and an image sensor, while specifying the area where the event has occurred, and may measure a directivity angle relative to the specified area. The input section may produce a control signal when the occurrence of the event has been detected and a directivity angle that specifies the area has been measured, the control signal corresponding to the measured directivity angle, while producing the acoustic signal using a sound source oriented toward the area where the event has occurred.

Specifically, the crowd behavior analysis section may calculate an angle relative to the position of the crowd as viewed from the installation position of the speaker array, based on the monitoring sensor and position information of the crowd acquired from crowd behavior analysis (e.g., latitude-longitude location acquired via GPS or the like), and may transmit the calculated data to the arithmetic section 32a of the power amplifier 3 in the speaker array, and at the same time, may automatically perform evacuation guidance or congestion mitigation, for example, by reproducing an optimum sound source at the position of the crowd.

Furthermore, for example, the directivity control system disclosed in the present specification may be applied to museums or the like where multiple and different types of voice guidance such as for explaining exhibits are required in small areas. Specifically, in the system, an occupancy sensor may be installed in a site where such voice guidance or the like is required, for use with a storage section in combination with a reproduction section. The storage section may store a directivity angle for outputting sound from a sound source, e.g., voice guidance, to the position where the occupancy sensor is established, and the voice guidance or the like outputted at the position. The reproduction section may read out the voice guidance or the like stored in the storage section and reproduce the voice data. Thus, when the occupancy sensor has detected an approach of an individual to an exhibit, the sound may be reproduced based on the directivity angle set in the directivity control system disclosed in the present specification. Specifically, the directivity control system may include an occupancy sensor section, a storage section, and a reproduction processing section. The occupancy sensor section may detect approaches of people to multiple sound fields. The storage section may store acoustic signals and control signals corresponding to the multiple sound fields. The control signals respectively have directivity angles for outputting sound from sound sources. If the occupancy sensor section detects an approach of an individual to any of the multiple sound fields, the reproduction processing section may read out an acoustic signal and a control signal corresponding to the detected sound field from the storage section and may transmit the read signals to the interface section.

In the directivity control system disclosed in the present specification, directivity can be changed within, for example, 100 ms after input of a directivity angle. Therefore, a moving sound-receiving target as mentioned above can be tracked without delay. In addition, due to such a function, the directivity control system can be used being linked with video.

As described above, as a single system, the directivity control system disclosed in the present specification is capable of simultaneously outputting sound from a plurality of sound sources with a plurality of different directivity patterns. Therefore, it is not necessary to install as many systems as the number of crowd positions or the number of small areas.

The system may include a storage section that stores in advance data of a directivity angle defined for the sound from the sound source to reach a predetermined sound-receiving position of a predetermined sound field. When data of a predetermined directivity angle is read from the storage section, the read data of the directivity angle may be automatically received by the interface section 31a.

The output surfaces of the speaker units may be provided with a LED (light emitting diode) display to configure an image production section that displays an image linked with the sound from the sound sources. The image production section may, for example, be internally or externally provided to the power amplifier 3 so that image data can be transmitted from the system controller 1 to the power amplifier 3. In particular, flat speakers, unlike cone speakers, will not cause image distortion due to the vibration of the speakers if a LED display is attached thereto, and therefore the speaker units can be effectively used as a screen.

FIG. 6 is a set of diagrams each illustrating an example in which the directivity control system is used in a concert venue. In FIG. 6(a), the speaker array on the stage is divided into two halves so that these halves of the speaker array can respectively output sound from different sound sources (e.g., English from the right half and Japanese from the left half) to two regions AF1 and AF2 of the audience seats. For example, the audience members who desire to hear English may be guided to the right side seats, while the audience members who desire to hear Japanese may be guided to the left side seats.

(b) is a diagram illustrating an example in which sound from different sound sources is outputted from a single speaker array to two regions AF3 and AF4. This is used similarly to the example shown in (a), but is favorably used in a venue which is too narrow to establish a divided speaker array.

(c) is a diagram illustrating an example in which sound from different sound sources is outputted from a single speaker array to three regions. Not only sound from different sources can be outputted to right and left regions AF5 and AF6 as in (b), but also sound from a sound source different from those for the regions AF5 and AF6 can be outputted to a region AF7 located at the center front.

As described above, the directivity control system disclosed in the present specification can output sound from a predetermined sound source to only a desired region in a venue which is not separated by soundproof walls, and at the same time can output sound from a different sound source to a region adjacent to the above region. Thus, the directivity control system can control sound from sound sources outputted to adjacent regions so as not to mix each other. In other words, the directivity control system can perform three dimensional directivity control for the speakers configuring a speaker array to provide sound fields for achieving long-distance transmission and clarity.

The technique disclosed in the present specification is not limited to the embodiments described above. Specifically, the present disclosure encompasses the embodiments shown as examples, and modifications based on the embodiments that can be achieved by a skilled person. The present disclosure also encompasses embodiments achieved by replacing or combining a component of one embodiment with a component of another embodiment. Furthermore, the disclosed technical scope is not limited to the description of the embodiments. The disclosed technical scope is defined by the recitation of the claims, and encompasses all changes equivalent to and within the scope of the claims.

REFERENCE SIGNS LIST

1 System controller
2 Transmission path
3 Power amplifier
4 Speaker array
4a Speaker block

What is claimed is:

1. A directivity control system that forms a variety of sound fields via a plurality of speaker units, comprising:
   a speaker block in which the plurality of speaker units are grouped by being fixedly connected in a predetermined array, each speaker unit having characteristics of being capable of output in the same phase from any site of a flat diaphragm, and being capable of sound reproduction covering all frequency bands;
   an interface section that receives an acoustic signal and a control signal for each of the plurality of speaker units configuring the speaker block, the acoustic signal outputting sound from a sound source, the control signal defining a directivity angle for the output according to at least horizontal directivity angle data and vertical directivity angle data, relative to a set position of each of the speaker units;
   an arithmetic section that calculates virtual delay time data for each of the speaker units, which are in a virtual array at the defined directivity angles, from the control signal received by the interface section, by separately calculating delay times of the upper end and lower end speaker units for the horizontal direction and separately calculating delay times of the left end and right end speaker units for the vertical direction, with intermediate portions between the upper and lower ends and between the left and right ends being interpolated based on the characteristics, and by adding horizontal delay time data calculated from the horizontal directivity angle and vertical delay time data calculated from the vertical directivity angle, the arithmetic section further calculating characteristic correction amount data for matching a sound volume or frequency characteristics in the case of the speaker units being in the virtual array, with either of a sound volume and frequency characteristics in the case of the speaker units being in a physical array at the respective directivity angles;

an acoustic data processing section that produces acoustic data from each acoustic signal received by the interface section, while producing output data that can reach a predetermined sound-receiving position by subjecting the speaker block to pseudo rotation based on the acoustic data, the delay time data corresponding to the acoustic data, and the characteristic correction amount data, and permitting the sound of the sound source to advance linearly, diffused or focused at the defined directivity angle; and an amplification section that amplifies the output data so as to be outputted to each of the speaker units, wherein the output data is outputted from the amplification section via each of the speaker units to form a predetermined sound field by the speaker block.

2. The directivity control system according to claim 1, wherein the interface section receives a plurality of different acoustic signals corresponding to a plurality of different sound sources, while receiving control signals corresponding to different directivity angles defined for the respective sound sources; and the acoustic data processing section produces different pieces of output data according to the different acoustic signals and control signals.

3. The directivity control system according to claim 1, wherein the system further comprises a sensor that detects at least either of a wind direction/speed and a temperature of a sound field where the output data is outputted; and the arithmetic section calculates variation (change amount) data according to data detected by the sensor, and calculates the delay time data based on the calculated variation (change amount) data.

4. The directivity control system according to claim 1, wherein the system at least comprises:

a crowd behavior analysis section that analyzes and detects occurrence of an event from a crowd behavior detected by a monitoring sensor that is configured by an acoustic sensor and an image sensor, while specifying an area where the event has occurred, and measures a directivity angle relative to the specified area; and an input section that produces a control signal when the occurrence of the event has been detected and a directivity angle that specifies the area has been measured, the control signal corresponding to the measured directivity angle, while producing the acoustic signal according to a sound source oriented toward the area where the event has occurred.

5. The directivity control system according to claim 1, wherein the system comprises:

a human sensor section that detects approaches of people to multiple sound fields;

a storage section that stores acoustic signals and control signals corresponding to the multiple sound fields, the control signals respectively having directivity angles for outputting sound from sound sources; and a reproduction processing section that, if the human sensor section detects an approach of an individual to any of the multiple sound fields, reads an acoustic signal and a control signal corresponding to the detected sound field from the storage section and transmits the read signals to the interface section.

6. The directivity control system according to claim 1, wherein the system comprises a storage section that stores in advance data of a directivity angle defined for the sound of the sound source to reach a predetermined sound-receiving position of a predetermined sound field; and when data of a predetermined directivity angle is read from the storage section, the read data of the directivity angle is automatically received by the interface section.

7. The directivity control system according to claim 1, wherein a speaker array is formed by fixedly binding a plurality of speaker blocks to enable directivity control in the entirety of the speaker array according to directivity control of the speaker blocks.

8. The directivity control system according to claim 7, wherein the speaker units are arranged in at least a flat, cylindrical or spherical shape in the entirety of the speaker block or the speaker array.

9. The directivity control system according to claim 1, wherein the system comprises an image production section in which a LED display is provided to output surfaces of the speaker units and an image linked with the sound from the sound sources is displayed on the LED display.

10. The directivity control system according to claim 2, wherein the system further comprises a sensor that detects at least either of a wind direction/speed and a temperature of a sound field where the output data is outputted; and the arithmetic section calculates variation (change amount) data according to data detected by the sensor, and calculates the delay time data based on the calculated variation (change amount) data.

11. The directivity control system according to claim 2, wherein the system at least comprises:

a crowd behavior analysis section that analyzes and detects occurrence of an event from a crowd behavior detected by a monitoring sensor that is configured by an acoustic sensor and an image sensor, while specifying an area where the event has occurred, and measures a directivity angle relative to the specified area; and an input section that produces a control signal when the occurrence of the event has been detected and a directivity angle that specifies the area has been measured, the control signal corresponding to the measured directivity angle, while producing the acoustic signal according to a sound source oriented toward the area where the event has occurred.

12. The directivity control system according to claim 2, wherein the system comprises:

a human sensor section that detects approaches of people to multiple sound fields;

a storage section that stores acoustic signals and control signals corresponding to the multiple sound fields, the control signals respectively having directivity angles for outputting sound from sound sources; and a reproduction processing section that, if the occupancy sensor section detects an approach of an individual to any of the multiple sound fields, reads an acoustic signal and a control signal corresponding to the detected sound field from the storage section and transmits the read signals to the interface section.

13. The directivity control system according to claim 2, wherein
the system comprises a storage section that stores in advance data of a directivity angle defined for the sound of the sound source to reach a predetermined sound-receiving position of a predetermined sound field; and
when data of a predetermined directivity angle is read from the storage section, the read data of the directivity angle is automatically received by the interface section.

14. The directivity control system according to claim 2, wherein a speaker array is formed by fixedly binding a plurality of speaker blocks to enable directivity control in the entirety of the speaker array according to directivity control of the speaker blocks.

15. The directivity control system according to claim 3, wherein a speaker array is formed by fixedly binding a plurality of speaker blocks to enable directivity control in the entirety of the speaker array according to directivity control of the speaker blocks.

16. The directivity control system according to claim 5, wherein a speaker array is formed by fixedly binding a plurality of speaker blocks to enable directivity control in the entirety of the speaker array according to directivity control of the speaker blocks.

17. The directivity control system according to claim 6, wherein a speaker array is formed by fixedly binding a plurality of speaker blocks to enable directivity control in the entirety of the speaker array according to directivity control of the speaker blocks.

18. The directivity control system according to claim 2, wherein the system comprises an image production section in which a LED display is provided to output surfaces of the speaker units and an image linked with the sound from the sound sources is displayed on the LED display.

19. The directivity control system according to claim 5, wherein the system comprises an image production section in which a LED display is provided to output surfaces of the speaker units and an image linked with the sound from the sound sources is displayed on the LED display.

* * * * *